(12) United States Patent
Marokkey et al.

(10) Patent No.: US 8,183,129 B2
(45) Date of Patent: May 22, 2012

(54) ALIGNMENT MARKS FOR POLARIZED LIGHT LITHOGRAPHY AND METHOD FOR USE THEREOF

(75) Inventors: Sajan Marokkey, Wappingers Falls, NY (US); Chandrasekhar Sarma, Poughkeepsie, NY (US); Alois Gutmann, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 58 days.

(21) Appl. No.: 12/694,105

(22) Filed: Jan. 26, 2010

(65) Prior Publication Data
US 2010/0128270 A1      May 27, 2010

Related U.S. Application Data

(62) Division of application No. 11/221,202, filed on Sep. 7, 2005, now Pat. No. 7,687,925.

(51) Int. Cl.
*H01L 21/00* (2006.01)
(52) U.S. Cl. . 438/462; 438/401; 438/975; 257/E23.179; 257/797; 439/65
(58) Field of Classification Search ........... 257/E23.179, 257/797, 786, 774, 782, 620, 622, 744; 438/108, 438/110, 112, 124–127, 401, 462, 694, 975; 428/132, 134, 195.1; 264/401; 439/65, 676, 439/941
See application file for complete search history.

(56) References Cited

U.S. PATENT DOCUMENTS

| | | | |
|---|---|---|---|
| 4,893,163 A | 1/1990 | Rudeck | |
| 4,981,529 A | 1/1991 | Tsujita | |
| 5,436,097 A * | 7/1995 | Norishima et al. | 430/5 |
| 5,601,957 A | 2/1997 | Mizutani et al. | |
| 5,777,392 A | 7/1998 | Fujii | |
| 5,841,520 A * | 11/1998 | Taniguchi | 355/53 |
| 5,923,996 A * | 7/1999 | Shih et al. | 438/462 |
| 6,037,671 A | 3/2000 | Kepler et al. | |
| 6,175,151 B1 | 1/2001 | Hashimoto et al. | |
| 6,177,636 B1 | 1/2001 | Fjelstad | |
| 6,202,297 B1 | 3/2001 | Faraci et al. | |
| 6,231,742 B1 | 5/2001 | Sano et al. | |

(Continued)

FOREIGN PATENT DOCUMENTS

JP         8-8156       1/1996

(Continued)

OTHER PUBLICATIONS

Brunner, T.A., "Impact of lens aberrations on optical lithography,"IBM Journal of Research and Development, 1997, 14 pages, vol. 41, No. 1/2, http://researchweb.watson.ibm.com/journal/rd/411/brunner.html, downloaded Aug. 30, 2005.

*Primary Examiner* — Chris Chu
(74) *Attorney, Agent, or Firm* — Slater & Matsil, L.L.P.

(57) ABSTRACT

Mark and method for integrated circuit fabrication with polarized light lithography. A preferred embodiment comprises a first plurality of elements comprised of a first component type, wherein the first component type has a first polarization, and a second plurality of elements comprised of a second component type, wherein the second component type has a second polarization, wherein the first polarization and the second polarization are orthogonal, wherein adjacent elements are of different component types. The alignment marks can be used in an intensity based or a diffraction based alignment process.

27 Claims, 5 Drawing Sheets

U.S. PATENT DOCUMENTS

| | | | |
|---|---|---|---|
| 6,239,031 B1 | 5/2001 | Kepler et al. | |
| 6,255,740 B1 | 7/2001 | Tsuji et al. | |
| 6,258,625 B1 | 7/2001 | Brofman et al. | |
| 6,340,793 B1 | 1/2002 | Yaguchi et al. | |
| 6,416,912 B1 * | 7/2002 | Kobayashi et al. | 430/22 |
| 6,451,626 B1 | 9/2002 | Lin et al. | |
| 6,458,411 B1 | 10/2002 | Goossen et al. | |
| 6,495,914 B1 | 12/2002 | Sekine et al. | |
| 6,509,247 B2 | 1/2003 | Chen et al. | |
| 6,509,639 B1 | 1/2003 | Lin et al. | |
| 6,521,900 B1 | 2/2003 | Hirayanagi | |
| 6,545,228 B2 | 4/2003 | Hashimoto et al. | |
| 6,550,666 B2 | 4/2003 | Chew et al. | |
| 6,578,754 B1 | 6/2003 | Tung | |
| 6,605,516 B2 * | 8/2003 | Jost et al. | 438/401 |
| 6,624,433 B2 | 9/2003 | Okumura et al. | |
| 6,624,653 B1 | 9/2003 | Cram | |
| 6,635,395 B2 * | 10/2003 | Hahmann et al. | 430/22 |
| 6,661,105 B2 | 12/2003 | Yamamoto et al. | |
| 6,683,723 B2 * | 1/2004 | Frosig et al. | 359/626 |
| 6,703,705 B2 | 3/2004 | Yamazaki et al. | |
| 6,765,287 B1 | 7/2004 | Lin et al. | |
| 6,774,317 B2 | 8/2004 | Fjelstad | |
| 6,794,741 B1 | 9/2004 | Lin et al. | |
| 6,803,668 B2 | 10/2004 | Holloway et al. | |
| 6,826,827 B1 | 12/2004 | Fjelstad | |
| 6,847,109 B2 | 1/2005 | Shim et al. | |
| 6,876,092 B2 * | 4/2005 | Ballarin | 257/797 |
| 6,921,916 B2 | 7/2005 | Adel et al. | |
| 7,138,299 B2 | 11/2006 | Fjelstad | |
| 7,207,807 B2 * | 4/2007 | Fogg | 439/65 |
| 7,301,634 B2 * | 11/2007 | Mieher et al. | 356/401 |
| 7,304,713 B2 * | 12/2007 | Yi | 349/158 |
| 7,323,784 B2 | 1/2008 | Yiu et al. | |
| 7,408,265 B2 * | 8/2008 | Holscher et al. | 257/797 |
| 7,625,679 B2 * | 12/2009 | Sullivan et al. | 430/22 |
| 2001/0037896 A1 | 11/2001 | Asai et al. | |
| 2003/0021466 A1 | 1/2003 | Adel et al. | |
| 2004/0114143 A1 | 6/2004 | Van Haren et al. | |
| 2005/0031969 A1 | 2/2005 | Finders et al. | |
| 2005/0116326 A1 | 6/2005 | Haba et al. | |
| 2005/0140986 A1 | 6/2005 | Butler | |
| 2005/0173805 A1 | 8/2005 | Damberg et al. | |
| 2005/0181544 A1 | 8/2005 | Haba et al. | |
| 2005/0181655 A1 | 8/2005 | Haba et al. | |
| 2005/0254030 A1 * | 11/2005 | Tolsma et al. | 355/53 |
| 2005/0285246 A1 | 12/2005 | Haba et al. | |
| 2005/0285283 A1 * | 12/2005 | Huggins | 257/797 |
| 2006/0040488 A1 | 2/2006 | Fjelstad | |
| 2007/0048629 A1 | 3/2007 | Marokkey | |
| 2007/0066046 A1 | 3/2007 | Fjelstad | |
| 2007/0205496 A1 | 9/2007 | Haba et al. | |

FOREIGN PATENT DOCUMENTS

| | | |
|---|---|---|
| JP | 10-189443 A | 7/1998 |
| JP | 2000-252203 | 9/2000 |
| JP | 2001-102285 | 4/2001 |
| JP | 2001-102285 A | 4/2001 |
| JP | 2003-7614 | 1/2003 |
| JP | 2003-92257 | 3/2003 |
| JP | 2004-348050 | 12/2004 |
| JP | 2005-197731 | 7/2005 |
| JP | 2005-197731 A | 7/2005 |
| JP | 2007-96292 | 4/2007 |
| WO | WO 02/19415 A1 | 3/2002 |
| WO | WO 03/069276 A1 | 8/2003 |

* cited by examiner

ALIGNMENT MARKS FOR POLARIZED LIGHT LITHOGRAPHY AND METHOD FOR USE THEREOF

This is a divisional application of U.S. application Ser. No. 11/221,202, which was filed on Sep. 7, 2005 now U.S. Pat. No. 7,687,925 and is incorporated herein by reference.

TECHNICAL FIELD

The present invention relates generally to integrated circuit fabrication, and more particularly to a mark and method for use of the mark in integrated circuit fabrication with polarized light lithography.

BACKGROUND

The fabrication of integrated circuits on semiconductor wafers typically requires a large degree of precision. With the state of the art feature sizes approaching 45 nanometers and below, a slight misalignment can result in a useless wafer. Since integrated circuits are typically made by fabricating multiple, successive layers, a misalignment of a single layer can result in an inoperable integrated circuit.

Misalignment can arise from several sources, such as an improperly aligned tool, an improperly aligned wafer, and so forth. An improperly aligned tool may be a tool that is used in the fabrication process, such as a holder for a semiconductor wafer or an optical system for a light lithography machine, which can be out of alignment based upon some reference. The reference may be another tool used in the fabrication process or a reference machine (a golden machine). An improperly aligned wafer may be a wafer that has not been inserted properly into a holder or a fabrication machine. The misalignment of the tool or wafer can result in errors such as portions of the integrated circuit being formed in a position that is different from intended, a portion of the integrated circuit being formed properly while another portion of the same integrated circuit is improperly formed, and so forth.

Alignment marks can be used by tools, such as exposure tools, to optically align a tool or a wafer. For example, to align a tool, a reference tool that holds a golden wafer can be used to provide alignment information for a tool being aligned. To align a wafer, alignment marks on the wafer can be used to provide alignment information.

One disadvantage of the prior art is that the alignment marks proposed in the past can be used to detect mechanical shift error and lens magnification errors. However, lens aberrations can also result in significant alignment errors and the prior art overlay targets do not adequately capture lens aberration errors.

A second disadvantage of the prior art is that the alignment marks proposed in the past do not take advantage of using polarized light.

SUMMARY OF THE INVENTION

These and other problems are generally solved or circumvented, and technical advantages are generally achieved, by preferred embodiments of the present invention which provides an alignment mark and method for use in integrated circuit fabrication with polarized light lithography.

In accordance with a preferred embodiment of the present invention, an alignment mark for use in integrated circuit fabrication is provided. The alignment mark includes a first plurality of elements of a first component type, and a second plurality of elements of a second component type. The first component type is arranged in a first orientation and the second component type is arranged in a second orientation, with the first orientation being orthogonal to the second orientation and adjacent elements being of differing component types.

In accordance with another preferred embodiment of the present invention, an alignment mark is provided. The alignment mark includes three portions. The first portion and the third portion contain elements arranged in a similar orientation and the second portion contains elements arranged in an orthogonal orientation to elements in the first portion and the third portion. Elements of the first portion, the second portion, and the third portion contain sub-elements, with each sub-element within a portion having the same orientation.

In accordance with another preferred embodiment of the present invention, a method for finding an alignment mark on a target is provided. The method includes applying a light to the target, capturing an image of the light from the target, and processing the image data to determine a location of the alignment mark. The alignment mark includes a first plurality of elements including a first plurality of elements of a first component type, and a second plurality of elements of a second component type.

An advantage of a preferred embodiment of the present invention is that the alignment mark can be used in integrated circuit fabrication to measure layer misalignments due to mechanical shifts, lens magnification errors, and lens aberration errors.

A further advantage of a preferred embodiment of the present invention is that the alignment mark can be used to align fabrication tools and wafers.

Yet another advantage of a preferred embodiment of the present invention is that the alignment mark can be used with both horizontal and vertical polarized light. This can simplify alignment mark design and use since a single alignment mark design can be used, rather than requiring multiple alignment mark designs.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely semiconductor fabrication using polarized light lithography, as well as tool and wafer alignment for use in the semiconductor fabrication. The invention may also be applied, however, to other semiconductor fabrication techniques involving lithography, including those using non-polarized light.

Figure 1A:
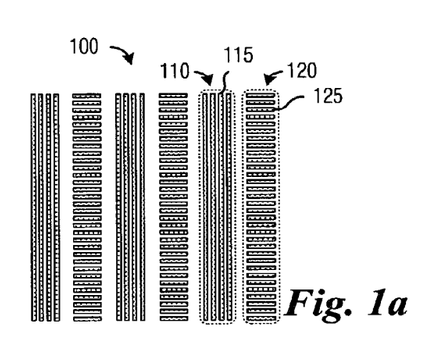
FIGS. 1a and 1b are diagrams of alignment marks for use in measuring X-axis and Y-axis alignment, according to a preferred embodiment of the present invention.
Figure 1B:
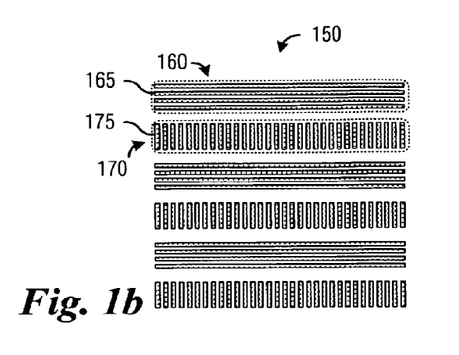

With reference now to FIGS. 1a and 1b, there are shown diagrams illustrating alignment marks for use in determining X-axis and Y-axis alignment, according to a preferred embodiment of the present invention. Determining X-axis and/or Y-axis alignment can involve the finding of alignment marks associated with one or both axes on a target that may contain one or more alignment marks. The diagram shown in FIG. 1a illustrates an alignment mark 100 for use in measuring X-axis alignment. The alignment mark 100 comprises a plurality of vertical components, such as a first vertical component 110 and second vertical component 120. The first vertical component 110 comprises vertically oriented sub-components, such as sub-component 115 and the second vertical component 120 comprises horizontally oriented sub-components, such as sub-component 125. The alignment mark 100 can be formed from an alternating pattern of the first vertical component 110 and the second vertical component 120. The vertical orientation of the alignment mark 100 provides additional information that can be used to help determine the alignment in the X-axis. The alignment mark 100 should contain at least two components, wherein one component has vertically oriented sub-components and another component has horizontally oriented sub-components.

The diagram shown in FIG. 1b illustrates an alignment mark 150 for use in measuring Y-axis alignment. The alignment mark 150 comprises a plurality of horizontal components, such as a first horizontal component 160 and a second horizontal component 170. The first horizontal component 160 comprises horizontally oriented sub-components, such as sub-component 165, and the second horizontal component 170 comprises vertically oriented sub-components, such as sub-component 175. The alignment mark 150 can be formed from an alternating pattern of the first horizontal component 160 and the second horizontal component 170. The horizontal orientation of the alignment mark 150 provides additional information that can be used to help determine alignment in the Y-axis. The alignment mark 150 should contain at least two components, wherein one component has vertically oriented sub-components and another component has horizontally oriented sub-components.

The dimensions of the vertical components and the horizontal components may be dependent upon factors such as the material used to create the components, the fabrication technology used to create the components, and so forth. For example, if the alignment mark was made from a poly material with a fabrication technology featuring 45 nanometer feature sizes, then it is preferred that a width of the sub-components be approximately 60 nanometers and a pitch of the sub-components be approximately 140 nanometers. Additionally, the components should be approximately 8 micrometers apart.

The amount of information contained in an alignment mark can be dependent upon a complexity of the components of the alignment mark. The alignment marks 100 and 150 shown in FIGS. 1a and 1b have relatively simple designs. Alignment marks containing more information can yield more efficiency, since the alignment marks can be smaller or fewer alignment marks can be used, fewer image captures may be needed to determine alignment, and so forth.

The alignment marks shown in FIGS. 1a and 1b (and in subsequent figures) can be formed in a layer of a semiconductor wafer (such as layer one) by illuminating a photomask with polarized light. When illuminated by a horizontally oriented polarized light, horizontally oriented sub-components (such as the sub-component 125 (FIG. 1a)) are patterned onto a photoresist layer that will be used to form layer one. When illuminated by a vertically oriented polarized light, vertically oriented sub-components (such as the sub-component 115) are patterned onto the photoresist layer. After patterning, the layer one may be completed with operations such as washing off unexposed portions of the photoresist layer, depositing structures in the layer one, and so forth, and the alignment mark can be used to determine alignment in the fabrication of subsequent layers.

The alignment marks can be formed using multiple exposures of polarized light, with a single exposure for horizontally oriented polarized light and a single exposure for vertically oriented polarized light. The use of horizontally oriented polarized light (vertically oriented polarized light) in conjunction with horizontally oriented structures (vertically oriented structures) is referred to as TE polarization or S polarization. Alternatively, a single exposure of light containing both horizontally oriented polarized light and vertically oriented polarized light can be used. One technique of simultaneously using both horizontally oriented and vertically oriented polarized light is commonly referred to as quadrupole illumination. Other illumination schemes for simultaneous exposure of horizontally oriented polarized light and vertically oriented polarized light are possible.

Figure 2A:
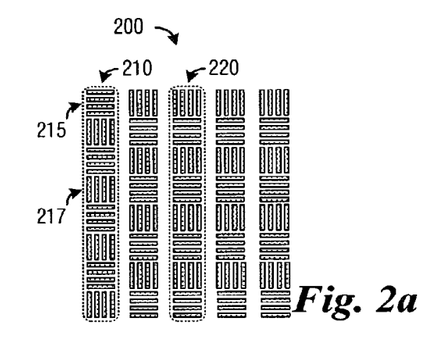
FIGS. 2a and 2b are diagrams of alignment marks for use in measuring X-axis and Y-axis alignment, according to a preferred embodiment of the present invention.

With reference now to FIGS. 2a and 2b, there are shown diagrams illustrating alignment marks for use in measuring X-axis and Y-axis alignment, wherein the alignment marks contain more information than the alignment marks shown in FIGS. 1a and 1b, according to a preferred embodiment of the present invention. The diagram shown in FIG. 2a illustrates an alignment mark 200 comprised of vertically oriented components for use in X-axis alignment, such as a first vertical component 210 and a second vertical component 220. Each of the vertically oriented components, for example, the first vertical component 210, is comprised of sub-components, such as sub-component 215 and sub-component 217. One sub-component, such as the sub-component 215, may be horizontally oriented, while the other sub-component, such as the sub-component 217, may be vertically oriented. Each component of the alignment mark 200 may be made up of alternating sub-components. Each component may have different arrangements of the alternating sub-components, the same arrangement of the alternating sub-components, or any combination in between.

Figure 2B:
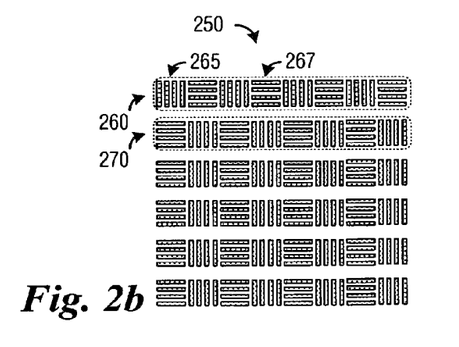

The diagram shown in FIG. 2b illustrates an alignment mark 250 comprised of horizontally oriented components for use in Y-axis alignment, such as a first horizontal component 260 and a second horizontal component 270. Each of the horizontally oriented components, for example, the first horizontal component 260, is comprised of sub-components, such as sub-component 265 and sub-component 267. One of the sub-components, such as the sub-component 265, may be vertically oriented, while the other sub-component, such as the sub-component 267, may be horizontally oriented. Each component of the alignment mark 250 may be made up of alternating sub-components. Each component may have different arrangements of the alternating sub-components, the same arrangement of the alternating sub-components, or any combination in between.

Figure 3A:
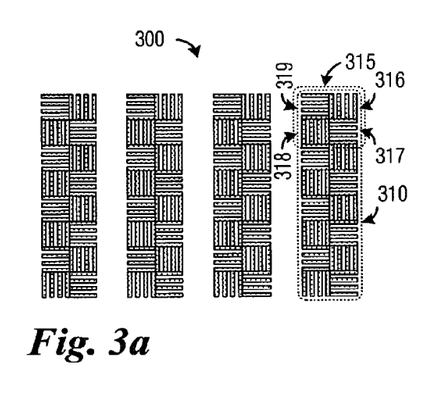
FIGS. 3a and 3b are diagrams of alignment marks for use in measuring X-axis and Y-axis alignment, according to a preferred embodiment of the present invention.

With reference now to FIGS. 3a and 3b, there are shown diagrams illustrating alignment marks for use in measuring X-axis and Y-axis alignment, wherein the alignment marks contain more information than the alignment marks shown in FIGS. 2a and 2b, according to a preferred embodiment of the present invention. The diagram shown in FIG. 3a illustrates an alignment mark 300 comprised of vertically oriented components for use in X-axis alignment, such as a vertical component 310. Each of the vertical components, such as vertical component 310, comprises multiple copies of a sub-component 315. In turn, the sub-component 315 comprises individual regions 316, 317, 318, and 319. The individual regions are differently oriented. For example, region 316 and region 318 are oriented vertically, while region 317 and region 319 are oriented horizontally. Although shown with four regions arranged into the sub-component 315, a different number of regions can be used without changing the spirit or scope of the present invention.

Figure 3B:
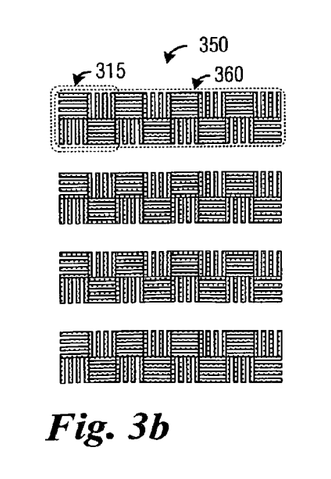

The diagram shown in FIG. 3b illustrates an alignment mark 350 comprised of horizontally oriented components for use in Y-axis alignment, such as a horizontal component 360. Each of the horizontal components, such as horizontal component 360, comprises multiple copies of a sub-component 315. In turn, the sub-components 315 comprise individual regions 316, 317, 318, and 319. The individual regions are differently oriented. For example, region 316 and region 318 are oriented vertically, while region 317 and region 319 are oriented horizontally.

The alignment marks shown in FIGS. 1a, 1b, 2a, 2b, 3a, and 3b can be used in separate processes to individually determine the alignment of the X-axis and Y-axis. In order to determine alignment in both the X-axis and the Y-axis, two separate processes may be required. In the fabrication of high-volume, low-price integrated circuits, it may be desirable to minimize setup time to increase production. In these circumstances, it may be desired that a single alignment mark be used that permits the determination of alignment in both the X-axis and the Y-axis with a single process. The use of a single process may significantly decrease setup time, especially if the image capture of the alignment marks consumes a large amount of time.

Figure 4A:
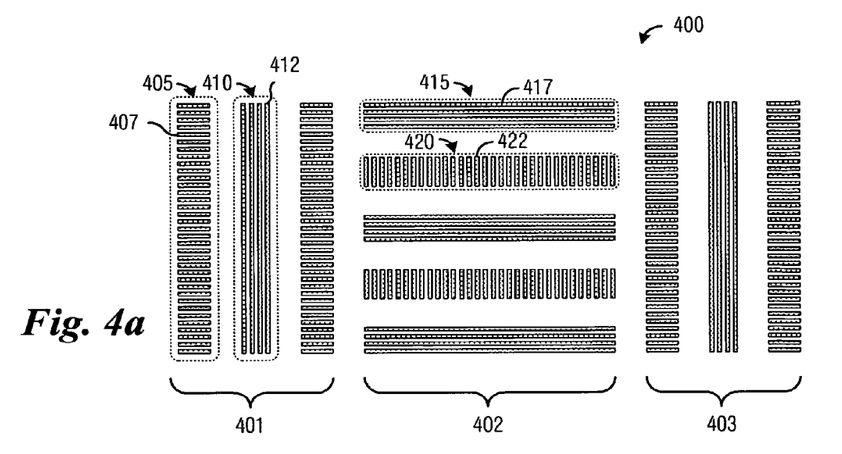
FIGS. 4a through 4c are diagrams of combination alignment marks for use in measuring both X-axis and Y-axis alignment in a single operation, according to a preferred embodiment of the present invention.
Figure 4B:
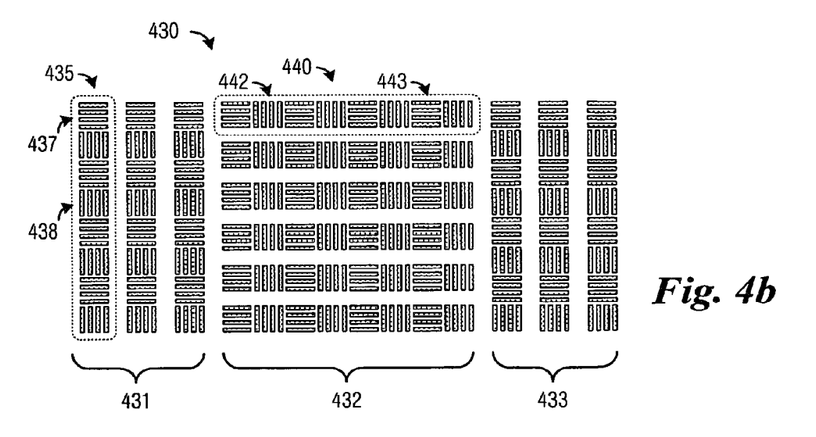
Figure 4C:
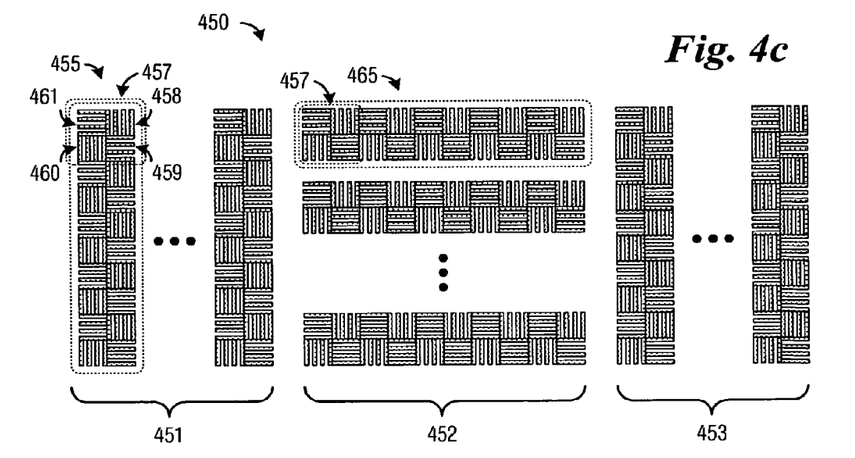

With reference now to FIGS. 4a through 4c, there are shown diagrams illustrating alignment marks, wherein the alignment marks can determine alignment in both the X-axis and the Y-axis with a single operation, according to a preferred embodiment of the present invention. The diagram shown in FIG. 4a illustrates an alignment mark 400 that can be used to determine alignment in both the X-axis and the Y-axis in a single operation, which can comprise an image capture and algorithmic processing of image data. The alignment mark 400 includes a first portion 401 containing a plurality of vertically oriented components, such as a first vertical component 405 and a second vertical component 410. The first vertical component 405 may be made up of horizontally oriented sub-components, such as horizontal sub-component 407, while the second vertical component 410 may be made up of vertically oriented sub-components, such as vertical sub-component 412. The first portion 401 of the alignment mark 400 should contain at least two components, one component with horizontally oriented sub-components (such as the first vertical component 405) and one component with vertically oriented sub-components (such as the second vertical component 410). Should the first portion 401 contain more than two components, the components should be arranged with alternating sub-component orientation. Alternatively, components with similar sub-component orientation can be arranged so that they are adjacent to each other. In yet another preferred embodiment, the components can be arranged in a random or pseudo-random fashion.

The alignment mark 400 also includes a second portion 402 that contains a plurality of horizontally oriented components, such as a first horizontal component 415 and a second horizontal component 420. The first horizontal component 415 may be made up of horizontally oriented sub-components, such as horizontal sub-component 417, while the second horizontal component 420 may be made up of vertically oriented sub-components, such as vertical sub-component 422. The second portion 402 of the alignment mark 400 should contain at least two components, one component with horizontally oriented sub-components (such as the first horizontal component 415) and one component with vertically oriented sub-components (such as the second horizontal component 420). Should the first portion 402 contain more than two components, the components should be arranged with alternating sub-component orientation. Alternatively, components with similar sub-component orientation can be arranged so that they are adjacent to each other. In yet another preferred embodiment, the components can be arranged in a random or pseudo-random fashion.

The alignment mark 400 also includes a third portion 403. According to a preferred embodiment of the present invention, the third portion 403 includes a plurality of vertically oriented components, similar to the first portion 401. The third portion 403 should have the same number of components as does the first portion 401, with the components arranged in a similar fashion. Alternatively, the third portion 403 may have a different number of components that is different from the number of components in the first portion 401 and the components in the third portion 403 can be arranged differently. Although the diagram in FIG. 4a illustrates the alignment mark 400 as having the second portion 402 with horizontally oriented components positioned in between the first portion 401 and the third portion 403 (both with vertically oriented components), an alternate alignment mark may have a second portion with vertically oriented components positioned in between a first portion and a third portion, both with horizontally oriented components. According to yet another preferred embodiment of the present invention, an alignment mark may have only two portions, a portion with horizontally oriented components and a portion with vertically oriented components.

The diagram shown in FIG. 4b illustrates an alignment mark 430 that can be used to determine alignment in both the X-axis and the Y-axis in a single operation. The alignment mark 430 includes a first portion 431 that contains a plurality of vertically oriented components, such as a vertical component 435. The vertical component 435, in turn, comprises a plurality of sub-components, such as a first sub-component 437 and a second sub-component 438. The first sub-component 437 may be horizontally oriented while the second sub-component 438 may be vertically oriented. The plurality of sub-components in the vertical component 435 may be arranged in an alternating fashion as shown in FIG. 4b. The first portion 431 is shown as being comprised of three vertically oriented components, however, it is possible to have embodiments of the alignment mark 430 with a different number of vertically oriented components, such as one, two, four, and so forth. Furthermore, the arrangement the plurality of sub-components of each vertically oriented component may be the same or they may be different in each of the vertically oriented components in the first portion 431.

The alignment mark 430 also includes a second portion 432, which contains a plurality of horizontally oriented components, such as horizontal component 440. The horizontal component 440 comprises a plurality of sub-components, such as a first sub-component 442 and a second sub-component 443, with the first sub-component 442 being vertically oriented and the second sub-component 443 being horizontally oriented. The plurality of sub-components in the horizontal component 440 may be arranged in an alternating fashion as shown in FIG. 4b. The second portion 432 is shown as being comprised of five horizontally oriented components, however, it is possible to have embodiments of the alignment mark 430 with a different number of horizontally oriented components, such as one, two, three, four, and so forth.

The alignment mark 430 further includes a third portion 433, which, according to preferred embodiment of the present invention, can contain components with the same orientation as the components in the first portion 431. Although the components of the third portion 433 may be oriented in the same direction, the third portion 433 may not need to contain the same number of components nor do the components in the third portion 433 need to have the same sub-component arrangement. The diagram shown in FIG. 4b illustrates the alignment mark 430 as having a horizontally oriented second portion 432 positioned in between vertically oriented first portion 431 and third portion 433. However, the second portion 432 can be vertically oriented while the first portion 431 and the third portion 433 may be horizontally oriented. Furthermore, each of the three portions (the first portion 431, the second portion 432, and the third portion 433) may have different numbers of components as well as sub-component arrangements.

The diagram shown in FIG. 4c illustrates an alignment mark 450, which includes a first portion 451 that comprises a plurality of vertically oriented components, such as vertical component 455. The vertical component 455 is formed from an arrangement of multiple instantiations of sub-component 457. The sub-component 457 comprises individually oriented regions, such as region 458, 459, 460, and 461. Region 458 and region 460 are oriented vertically, while region 459 and 461 are oriented horizontally. Although shown in FIG. 4c as having a same number of sub-components 457, each vertical component in the first portion 451 can be formed with a different number of sub-components 457.

The alignment mark 450 also includes a second portion 452 that is comprised of a plurality of horizontally oriented components, such as horizontal component 465. As with the vertically oriented components in the first portion 451 of the alignment mark 450, the horizontally oriented components of the second portion, such as the horizontal component 465, can be formed from multiple instantiations of the sub-component 457. The alignment mark 450 further includes a third portion 453, which like the first portion, is comprised of vertically oriented components. The third portion 453 may have the same number of vertically oriented components as the first portion 451 or it may have a different number. The diagram shown in FIG. 4c illustrates the alignment mark 450 as having a horizontally oriented second portion 452 positioned in between vertically oriented first portion 451 and third portion 453. However, the second portion 452 can be vertically oriented while the first portion 451 and the third portion 453 may be horizontally oriented. Furthermore, each of the three portions (the first portion 451, the second portion 452, and the third portion 453) may have different numbers of components.

The proper alignment of wafers and tools are important to the proper fabrication of integrated circuits. However, since the volume typically involved in the fabrication of semiconductors and wafer layers is very large, significant time may not be available to devote to the alignment of individual wafers. Time devoted to the alignment of the wafers may result in increased product yield, however, the increased yield is achieved at the price of an overall decrease in the number of integrated circuits fabricated. The tools used in semiconductor fabrication are extremely precise in nature and require accurate calibration and configuration. Since the tools need to be calibrated and configured only periodically, more time can be spent in performing these tasks without significantly impacting the number of integrated circuits fabricated. Tool calibration (such as alignment) is additionally important in polarized light lithography since the horizontal and vertical polarized components are imaged separately. Alignment marks with separate vertical and horizontal polarized components can provide a necessary increase in the precision of the alignment process.

Figure 5A:
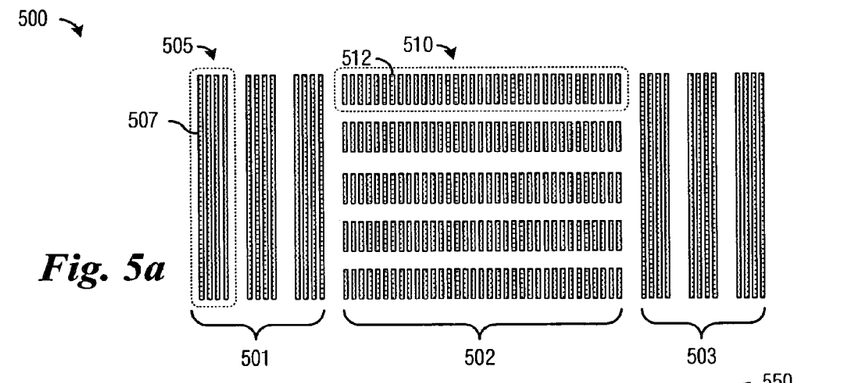
FIGS. 5a and 5b are diagrams of combination alignment marks for use in both X-axis and Y-axis alignment in a single operation, according to a preferred embodiment of the present invention.
Figure 5B:
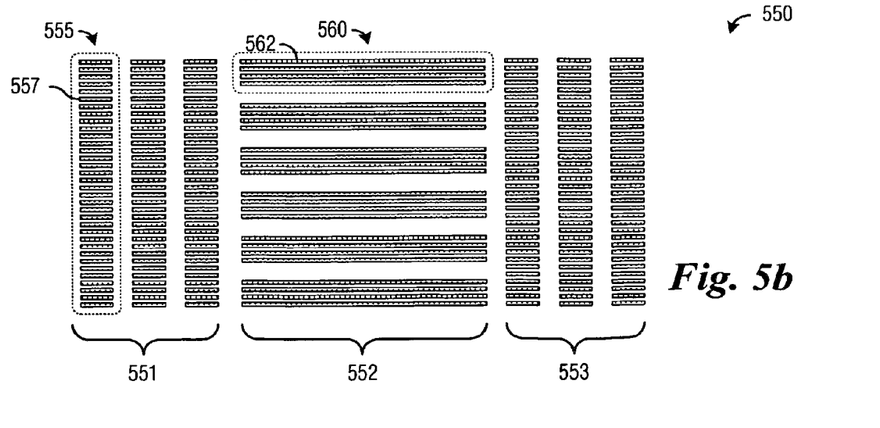

With reference now to FIGS. 5a and 5b, there are shown diagrams illustrating alignment marks with separate horizontal and vertical oriented components, wherein the alignment marks can be used for alignment of fabrication tools, according to a preferred embodiment of the present invention. The alignment marks shown in FIGS. 5a and 5b can be used to determine the alignment of both the X-axis and the Y-axis in a single operation. The diagram shown in FIG. 5a illustrates an alignment mark 500 for use in the alignment of tools or wafers. The alignment mark 500 can be used to align wafers, fabrication tools, and so forth. However, the alignment mark 500 can provide a degree of precision which is ideally suited for the alignment of fabrication tools, where increased alignment process time can be spent to achieve greater alignment precision.

The alignment mark 500 comprises multiple portions (similar to the alignment marks shown in FIGS. 4a through 4c) that can be used to specifically target alignment along different axes. For example, a first portion 501 comprises multiple vertically oriented components, such as vertical component 505. The vertical component 505 is formed from vertically oriented sub-components, such as sub-component 507. A second portion 502 comprises multiple horizontally oriented components, such as horizontal component 510. The horizontal component 510 is formed from vertically oriented sub-components, such as sub-component 512. Finally, a third portion 503 is formed from vertically oriented components, like the first portion. All components in the alignment mark 500 are formed with vertically oriented sub-components that were patterned on a photoresist layer with vertically polarized light. The orientation of the components in the first portion 501, the second portion 502, and the third portion 503 can be switched without affecting the spirit and scope of the present invention.

The diagram shown in FIG. 5b illustrates an alignment mark 550 for use in the alignment of tools or wafers. Similar to the alignment mark 500 (FIG. 5a), the alignment mark can be divided into three portions, a first portion 551 containing vertically oriented components (such as vertical component 555), a second portion 552 containing horizontally oriented components (such as horizontal component 560), and a third portion 553 that is similar to the first portion and contains vertically oriented components. However, where the components of the alignment mark 500 were formed with sub-components that are vertically oriented, the components of the alignment mark 550 are formed with sub-components that are horizontally oriented, such as sub-component 557 and sub-component 562, for example.

The use of a pair of alignment marks can permit a determination of the alignment along both the X-axis and the Y-axis of fabrication tools and/or wafers. The use of components with a single orientation (either horizontal or vertical) can provide a large amount of alignment information that can be used to determine alignment. If components with both orientations (both horizontal and vertical) are used, then the amount of alignment information present in an alignment mark is approximately one-half of an alignment mark of substantially equal size that makes use of components with a single orientation.

The image capture of alignment marks can occur in several different ways. A first way to capture an image of the alignment marks is to use an image based system (this is commonly referred to as being an intensity based system) wherein an image sensor, such as a charge coupled device (CCD), captures an image of the alignment marks in a single operation. This is similar to taking a picture with a camera. The alignment marks discussed in FIGS. 1a and 1b, FIGS. 2a and 2b, FIGS. 3a and 3b, FIGS. 4a through 4c, and FIGS. 5a and 5b can be used in image based systems. A second way to capture an image of the alignment marks is to scan across the alignment marks and capture light diffracted from the alignment marks (this is commonly referred to as being a diffraction based system). In a diffraction based system, a laser, for example, can scan across a surface containing the alignment marks and a sensor can capture light diffracting from the surface. The alignment marks used in a diffraction based system may be different from the alignment marks used in an image based system to permit optimization of alignment performance.

Figure 6A:
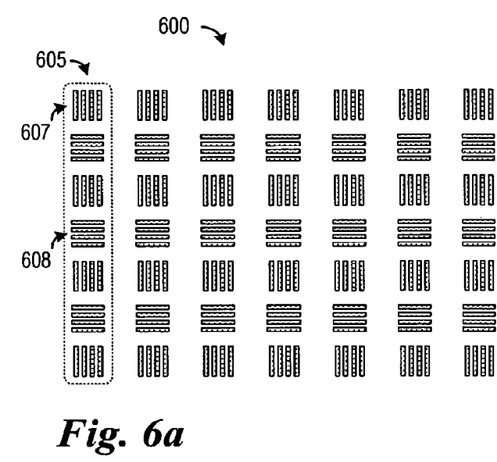
FIGS. 6a through 6c are diagrams of combination alignment marks for use in both X-axis and Y-axis alignment in a single operation with diffraction based alignment systems, according to a preferred embodiment of the present invention.
Figure 6B:
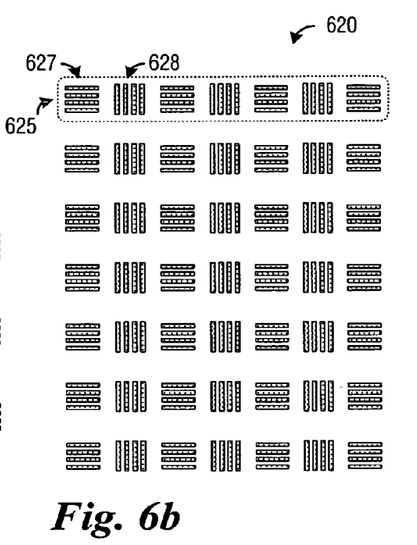
Figure 6C:
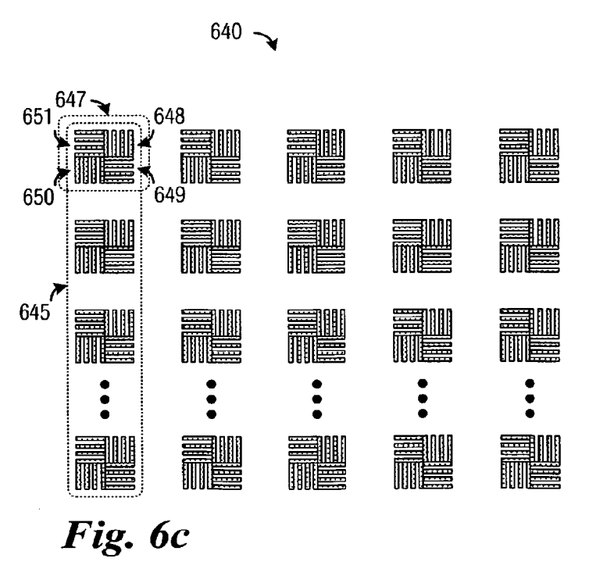

With reference now to FIGS. 6a through 6c, there are shown diagrams illustrating alignment marks for use in diffraction based alignment systems in polarized light lithography, according to a preferred embodiment of the present invention. The diagram shown in FIG. 6a illustrates an alignment mark 600 for determining X-axis alignment using a diffraction based alignment system. The alignment mark 600 comprises multiple vertically oriented components, such as vertical component 605. Each vertical component is formed from sub-components with either a horizontal orientation or a vertical orientation. For example, sub-component 607 has a vertical orientation and sub-component 608 has a horizontal orientation. Although shown in FIG. 6a with a particular configuration of sub-component orientation, it is possible to alter the sub-component orientation without affecting the spirit or scope of the present invention.

According to a preferred embodiment of the present invention, the pitch and width of the components and sub-components are to be kept close to design rules and constraints for the material used to create the alignment mark 600. For example, if poly was to be used to create the alignment mark 600 in a 45 nanometer fabrication process, then line width may be approximately 60 nanometers while pitch may be approximately 140 nanometers. Pitch between adjacent sub-components of differing polarization should be approximately 8 micrometers, while separation between adjacent vertical components should be approximately 20 micrometers.

The diagram shown in FIG. 6b illustrates an alignment mark 620 for determining Y-axis alignment using a diffraction based alignment system. The alignment mark 620 comprises multiple horizontally oriented components, such as horizontal component 625. Each horizontal component is formed from sub-components with either a horizontal orientation (such as sub-component 627) or a vertical orientation (such as sub-component 628). As shown in FIG. 6b, the sub-components alternate with each other within a single horizontal component. However, other sub-component arrangements are possible. For example, sub-components with the same orientation can be paired together.

The diagram shown in FIG. 6c illustrates an alignment mark 640 for determine X-axis and Y-axis alignment using a diffraction based alignment system. The alignment mark 640 comprises multiple vertically oriented components, such as vertical component 645. Each vertical component is formed from repeated instantiations of sub-component 647. The sub-component 647 comprises individually oriented regions, such as region 648, region 649, region 650, and region 651, with region 648 and region 650 being oriented vertically and region 649 and 651 being oriented horizontally. According to a preferred embodiment of the present invention, the alignment mark 640 is sized so that it is kept as close to design rules of the material used to form the alignment mark 640 as possible. For example, for a 45 nanometer fabrication process poly layer, the line width should be approximately 60 nanometers while the pitch should be approximately 140 nanometers.

Figure 7A:
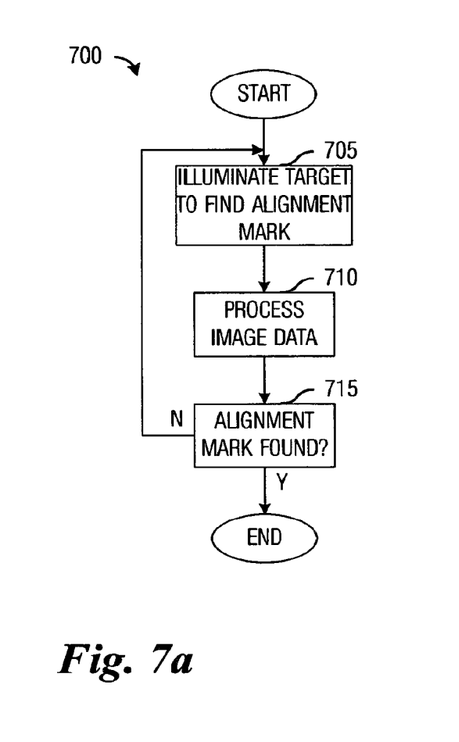
FIGS. 7a through 7c are diagrams of alignment process algorithms, according to a preferred embodiment of the present invention.
Figure 7B:
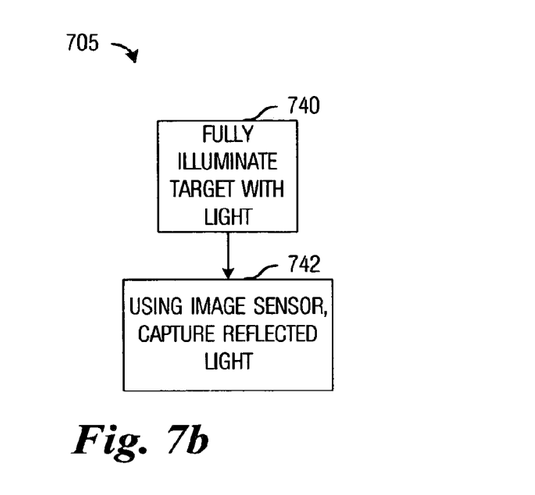
Figure 7C:
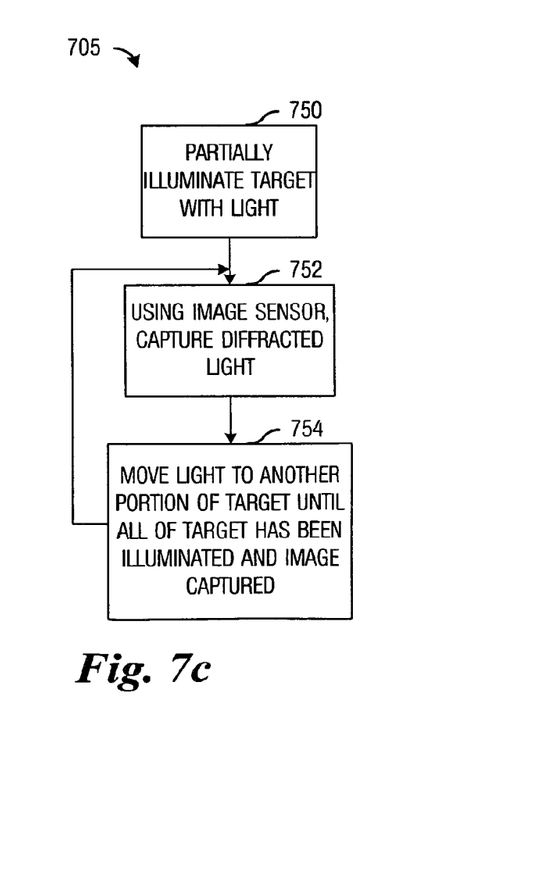

With reference now to FIGS. 7a through 7c, there are shown diagrams illustrating algorithms for the use of alignment marks, according to a preferred embodiment of the present invention. The diagram shown in FIG. 7a illustrates an algorithm 700 for the use of alignment marks to align fabrication tools, semiconductor wafers, and so forth. The algorithm 700 may be executed by fabrication control equipment responsible for controlling the fabrication tools, positioning wafers, and so forth. Alternatively, the algorithm 700 may be descriptive of a sequence of events occurring in the alignment of fabrication tools, semiconductor wafers, and so on.

Not shown the diagram in FIG. 7a may be events and operations that are performed prior to it being necessary to perform an alignment operation. These events and operations may include but are not limited to placing a semiconductor wafer onto a holder, placing a photomask of a wafer layer into position, powering on fabrication equipment, and so forth. Once it becomes necessary to align the fabrication tool, semiconductor wafer, or wafer layer, a scan (or image) of the target (such as a semiconductor wafer) can be made to find the presence of an alignment mark(s) with illumination being provided by a light (the light may be unpolarized or polarized) is performed (block 705). The illumination of the target can be achieved by fully illuminating the target and then capturing an image of the target with an optical sensor, such as a CCD. This is akin to taking a picture of the target. Alternatively, a first portion of the target can be illuminated by a light source and an image can be captured with an optical sensor. Once an image is made of the first portion of the target then a second portion of the alignment mark can be illuminated and a second image can be captured. This can be repeated until the entire target has been illuminated and images captured. This is analogous to an optical scanner moving a light source across the target and capturing images of the illuminated portions of the target with an optical sensor. A discussion of the different techniques for capturing images of the target is provided below.

After capturing images of the illuminated target, the captured image data can be processed to determine an alignment of the fabrication tool, semiconductor wafer, or wafer layer by finding the alignment mark(s) (block 710). The data processing can be used to find the alignment mark(s) (block 715). If the alignment mark(s) are not found, then the image capture of the target can be repeated, perhaps with a different light or different set of processing parameters. With the alignment mark(s) found, it can be possible to align the tools, semiconductor wafers, and so forth to the alignment mark(s).

Depending on the design of the alignment mark, the alignment process performed using the algorithm 700 may only be able to provide alignment information for one axis (either the X-axis or the Y-axis). If it is desired to perform an alignment along both axes, the alignment process may need to be repeated with another alignment mark(s) that provides alignment information for the axis for which the first alignment process did not provide alignment information. If the alignment mark provides alignment information for both axes, then it may only be necessary to perform the alignment process once.

The diagram shown in FIG. 7b illustrates a detailed view of a technique for capturing images of a target illuminated with light (polarized or unpolarized) commonly referred to as intensity based alignment processing. The technique shown in FIG. 7b may be an implementation of the block 705 shown in FIG. 7a. The target is initially illuminated in its entirety by a light (block 740) and then an image sensor can capture light reflected from the target (block 742). To obtain accurate alignment information, more than one alignment mark may need to be used.

The diagram shown in FIG. 7c illustrates a detailed view of a technique for capturing images of a target illuminated with laser light commonly referred to as diffraction based alignment processing. The technique shown in FIG. 7c may be an implementation of the block 705 shown in FIG. 7a. A first portion of the target is initially illuminated by a light source (block 750) and then an image sensor can capture light diffracted from the first portion of the target (block 752). After the image capture (block 752), the light source is moved so that a second portion of the target is illuminated (block 754) and an image capture of the second portion of the target (block 752) is made. The light source is moved over the target until all of the target has been illuminated and image captures are made for each portion of the target. Again, to obtain accurate alignment information, more than one alignment mark may need to be used.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for finding an alignment mark on a target, the method comprising:
   applying a polarized light to the target having the alignment mark, wherein the alignment mark comprises:
      a first plurality of first elements comprising a first component type, wherein the first component type has a first orientation, and
      a second plurality of second elements comprising a second component type, wherein the second component type has a second orientation, wherein the first orientation and the second orientation are orthogonal, wherein adjacent elements are of differing component types;
   capturing an image of the polarized light from the target, the image comprising alignment information from the alignment mark; and
   processing the captured image to determine a location of the alignment mark.

2. The method of claim 1, wherein the first elements and the second elements are vertically oriented.

3. The method of claim 1, wherein the first elements and the second elements are horizontally oriented.

4. The method of claim 1, wherein the first elements and the second elements are alternatingly arranged into vertical columns.

5. The method of claim 1, wherein the first elements and the second elements are alternatingly arranged into horizontal rows.

6. The method of claim 1, wherein the first elements and the second elements are positioned based upon design rules for an integrated circuit layer being fabricated.

7. The method of claim 1, wherein the first elements and the second elements are arranged into groups of four, wherein there are two of the first elements and two of the second elements in each group of four, wherein the groups of four are arranged into vertical columns, and wherein the vertical columns are laid out horizontally.

8. The method of claim 1, wherein the first elements and the second elements are arranged into groups of four, wherein there are two of the first elements and two of the second elements in each group of four, wherein the groups of four are arranged into horizontal rows, and wherein the horizontal rows are laid out vertically.

9. The method of claim 1, wherein the alignment mark is partitioned into three portions, wherein a first portion contains the first or the second elements with a same orientation as the first or the second elements in a third portion, and wherein a second portion contains the first or the second elements oriented orthogonally with respect to the first or second elements in the first portion and the third portion.

10. The method of claim 9, wherein the first portion and the third portion contain the first elements and the second elements arranged vertically.

11. The method of claim 9, wherein the first portion and the third portion contain the first elements and the second elements o alternatingly arranged into vertical columns.

12. The method of claim 9, wherein the first portion and the third portion contain the first elements and the second elements arranged into groups of four, wherein there are two of the first elements and two of the second elements in each group of four, and wherein the groups of four are arranged into vertical columns.

13. The method of claim 1, wherein the alignment mark is used to determine position information of one or more selected from the group comprising: semiconductor fabrication tools, semiconductor wafers, and wafer layer masks.

14. The method of claim 1, wherein applying the polarized light to the target comprises illuminating an entirety of the target.

15. The method of claim 1, wherein applying the polarized light to the target comprises illuminating a first portion of the target, and after capturing of the image, the method further comprises illuminating a second portion of the target.

16. The method of claim 15, wherein illuminating and capturing is repeated until an entirety of the target has been illuminated.

17. The method of claim 1, wherein alignment information is used for two axes, wherein the two axes are orthogonal, wherein the alignment mark provides alignment information for a first axis and wherein a second alignment mark provides alignment information for a second axis, further comprising applying the polarized light to a second target having the second alignment mark, capturing a second image of the polarized light from the second target, and processing the captured second image for the second alignment mark.

18. The method of claim 1, wherein the image comprises an intensity pattern or a diffraction pattern.

19. A method for finding an alignment mark on a target, the method comprising:
applying a light to the target having the alignment mark, wherein the alignment mark comprises:
a first plurality of first elements, each first element comprising a plurality of first sub elements disposed on a substrate, wherein the first sub elements all have a first orientation, are all substantially a same size and are aligned relative to each other, and
a second plurality of second elements, each second element comprising a plurality of second sub elements disposed on the substrate, wherein the second sub elements all have a second orientation, are all substantially a same size and are aligned relative to each other, wherein the first orientation and the second orientation are substantially orthogonal,
wherein all of the first elements and all of the second elements are formed on one layer, wherein the first elements and the second elements are arranged into a plurality of groups of four, wherein there are two of the first elements and two of the second elements in each group of four, wherein the groups of four are arranged into a plurality of columns;
capturing an image of the light from the target, the image comprising alignment information from the alignment mark; and
processing the image to determine a location of the alignment mark.

20. The method of claim 19, wherein the first elements and the second elements are alternatingly arranged.

21. The method of claim 19, wherein the first and second elements of the group of four are aligned relative to each other.

22. The method of claim 19, wherein there are four sub elements for the first or second element.

23. A method for finding an alignment mark on a target, the method comprising:
applying a light to the target, wherein the alignment mark comprises:
a plurality of columns, each of the columns comprising two sub-columns, the sub-columns divided into a plurality of adjacent segments, each of the adjacent segments alternatively comprising a plurality of aligned elements all having substantially a same size and shape and all being substantially parallel to the sub-columns and a plurality of aligned elements all having substantially a same size and shape and all being substantially orthogonal to the sub-columns, wherein all of the aligned elements substantially parallel to the sub-columns and the aligned elements substantially orthogonal to the sub-columns in the adjacent segments formed in a single layer of an integrated circuit,
capturing an image of the light from the target, the image comprising alignment information from the alignment mark; and
processing the captured image to determine a location of the alignment mark.

24. The method of claim 23, wherein segments in a first sub-column comprising aligned elements substantially parallel to the sub-columns are adjacent to segments in a second sub-column comprising aligned elements substantially orthogonal to the sub-columns.

25. The method of claim 23, wherein segments in a first sub-column comprising aligned elements substantially orthogonal to the sub-columns are adjacent to segments in a second sub-column comprising aligned elements substantially parallel to the sub-columns.

26. A method for finding an alignment mark on a target, the method comprising:
applying a light to the target having the alignment mark, wherein the alignment mark comprises:
a first plurality of first elements comprising a first component type, wherein the first component type has a first orientation, and
a second plurality of second elements comprising a second component type, wherein the second component type has a second orientation, wherein the first orientation and the second orientation are orthogonal, wherein adjacent elements are of differing component types;
capturing an image of the light from the target, the image comprising alignment information from the alignment mark; and
processing the captured image to determine a location of the alignment mark, wherein the first elements and the second elements are arranged into groups of four, wherein there are two of the first elements and two of the second elements in each group of four, wherein the groups of four are arranged into vertical columns, and wherein the vertical columns are laid out horizontally.

27. A method for finding an alignment mark on a target, the method comprising:
applying a light to the target having the alignment mark, wherein the alignment mark comprises:
a first plurality of first elements comprising a first component type, wherein the first component type has a first orientation, and a second plurality of second elements comprising a second component type, wherein the second component type has a second orientation, wherein the first orientation and the second orientation are orthogonal, wherein adjacent elements are of differing component types;

capturing an image of the light from the target, the image comprising alignment information from the alignment mark; and processing the captured image to determine a location of the alignment mark, wherein the alignment mark is partitioned into three portions, wherein a first portion contains the first or the second elements with a same orientation as the first or the second elements in a third portion, wherein a second portion contains the first or the second elements oriented orthogonally with respect to the first or second elements in the first portion and the third portion, wherein the first portion and the third portion contain the first elements and the second elements arranged into groups of four, wherein there are two of the first elements and two of the second elements in each group of four, and wherein the groups of four are arranged into vertical columns.

* * * * *